(12) United States Patent  
Xu et al.

(10) Patent No.: US 9,525,013 B2
(45) Date of Patent: Dec. 20, 2016

(54) ORGANIC LIGHT-EMITTING DIODE DISPLAY DEVICE AND ITS MANUFACTURING METHOD

(71) Applicant: BOE TECHNOLOGY GROUP CO., LTD., Beijing (CN)

(72) Inventors: Xiaowei Xu, Beijing (CN); Lei Shi, Beijing (CN); Wenqing Xu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 64 days.

(21) Appl. No.: 14/651,119

(22) PCT Filed: Sep. 30, 2014

(86) PCT No.: PCT/CN2014/087858
§ 371 (c)(1),
(2) Date: Jun. 10, 2015

(87) PCT Pub. No.: WO2015/184712
PCT Pub. Date: Dec. 10, 2015

(65) Prior Publication Data
US 2016/0276418 A1    Sep. 22, 2016

(30) Foreign Application Priority Data

Jun. 5, 2014    (CN) .......................... 2014 1 0247203

(51) Int. Cl.
*H01L 29/08*    (2006.01)
*H01L 27/32*    (2006.01)
(Continued)

(52) U.S. Cl.
CPC ......... *H01L 27/3246* (2013.01); *H01L 27/322* (2013.01); *H01L 51/52* (2013.01);
(Continued)

(58) Field of Classification Search
CPC .................................................. H01L 27/3246
(Continued)

(56) References Cited

U.S. PATENT DOCUMENTS

2004/0160165 A1* 8/2004 Yamauchi .......... H01L 27/3246
                                                                 313/498
2004/0183436 A1    9/2004 Ito et al.
(Continued)

FOREIGN PATENT DOCUMENTS

CN    104037357 A    9/2014

OTHER PUBLICATIONS

First Office Action regarding Chinese application No. 201410247203.0, dated Dec. 16, 2014. Translation provided by Dragon Intellectual Property Law Firm.
(Continued)

*Primary Examiner* — Ajay K Arora
(74) *Attorney, Agent, or Firm* — Harness, Dickey & Pierce, P.L.C.

(57) ABSTRACT

The present disclosure provides an OLED display device and its manufacturing method. The OLED display device includes an anode layer, a cathode layer, and a pixel-defined layer and a light-emitting layer both arranged between the anode layer and the cathode layer. The pixel-defined layer is provided with an opening, and the light-emitting layer is arranged in the opening. An insulating layer having a refractive index greater than that of the pixel-defined layer is arranged between the light-emitting layer and the pixel-defined layer.

19 Claims, 3 Drawing Sheets

(51) Int. Cl.
    *H01L 51/52*  (2006.01)
    *H01L 51/56*  (2006.01)
(52) U.S. Cl.
    CPC .......... *H01L 51/5275* (2013.01); *H01L 51/56* (2013.01); *H01L 2227/323* (2013.01); *H01L 2251/301* (2013.01); *H01L 2251/303* (2013.01); *H01L 2251/558* (2013.01)
(58) Field of Classification Search
    USPC .......................................................... 257/40
    See application file for complete search history.

(56) References Cited

U.S. PATENT DOCUMENTS

| | | | |
|---|---|---|---|
| 2007/0103062 A1 | 5/2007 | Jung et al. | |
| 2012/0319115 A1* | 12/2012 | Lee .................... | H01L 27/1259 257/59 |
| 2014/0131690 A1* | 5/2014 | Kondo ................ | H01L 51/5203 257/40 |
| 2015/0188093 A1* | 7/2015 | Kim .................... | H01L 51/5275 257/40 |

OTHER PUBLICATIONS

Second Office Action regarding Chinese application No. 201410247203.0, dated Jun. 3, 2015. Translation provided by Dragon Intellectual Property Law Firm.
Written Opinion of the International Searching Authority for international application No. PCT/CN2014/087858.

* cited by examiner

ORGANIC LIGHT-EMITTING DIODE DISPLAY DEVICE AND ITS MANUFACTURING METHOD

CROSS-REFERENCE TO RELATED APPLICATION

The present application is the U.S. national phase of PCT Application No. PCT/CN2014/087858 filed on Sep. 30, 2014, which claims a priority of the Chinese patent application No. 201410247203.0 filed on Jun. 5, 2014, which are incorporated herein by references in their entirety.

TECHNICAL FIELD

The present disclosure relates to the field of display manufacturing, in particular to an organic light-emitting diode (OLED) display device and its manufacturing method.

BACKGROUND

Along with the development of display technologies, flat-panel display device has become a mainstream of the display devices due to such features as being light and thin. Among various flat-panel display devices, OLED display devices and active matrix/organic light-emitting diode (AMOLED) display devices have been widely used nowadays.

For the OLED display device, a light beam from a light-emitting layer is transmitted to the outside through various layers in the OLED display device. The light beam is refracted when it passes from one medium into another medium. FIG. 1 is a partial, schematic view showing the OELD element. The OLED display device includes a substrate 101, and an electrode 102 and a pixel-defined layer 103 arranged on the substrate 101. The pixel-defined layer 103 is provided with a plurality of openings at the substrate 101, so as to expose the electrode 102 and form a predetermined pattern. A light-emitting layer 105 is arranged at each opening. However, when the light beam from the light-emitting layer 105 reaches the pixel-defined layer 103, total reflection will occur at an interface between the pixel-defined layer 103 and air due to a significant difference between refractive indices of the pixel-defined layer 103 and air. As a result, the light beam is constrained within the pixel-defined layer 103 and cannot be used for display.

Hence, there is a remarkable light loss inside the OLED display device, when the light beam passes from one medium to another medium. To be specific, the light loss at an interface between ITO and glass occupies about 50%, and the light loss at an interface between the glass and air occupies about 30%. In this regard, even if the internal quantum efficiency is up to 100%, the light output efficiency is merely 20%. How to increase the light output efficiency has become a critical factor for improving the external quantum efficiency of the OLED.

The light loss also occurs in an AMOLED display device with a top-emission structure when the light beam is transmitted through the interface between different media.

SUMMARY

An object of the present disclosure is to provide an organic light-emitting diode (OLED) display device and its manufacturing method, so as to improve the light output efficiency of the OLED display device.

In one aspect, the present disclosure provides in embodiments an OLED display device, including an anode layer, a cathode layer, and a pixel-defined layer and a light-emitting layer both arranged between the anode layer and the cathode layer. The pixel-defined layer is provided with an opening, and the light-emitting layer is arranged in the opening. An insulating layer having a refractive index greater than that of the pixel-defined layer is arranged between the light-emitting layer and the pixel-defined layer.

Alternatively, the pixel-defined layer is made of polyimide (PI), polymethyl methacrylate (PMMA) or phenolic resin, and the insulating layer is made of $Ti_2O_3$, $TiO_2$ or ZnSe.

Alternatively, the insulating layer is of a curved, arc structure at the opening.

Alternatively, an angle between the curved, arc structure and a plane where the anode layer is located is 20° to 45°.

Alternatively, the insulating layer is of a thickness of 10 nm to 1000 nm.

Alternatively, a surface of the insulating layer adjacent to the light-emitting layer is provided with a plurality of microplanes oblique to each other at different angles and configured to refract a light beam entering the insulating layer, so as to totally reflect the refracted light beam at an interface between the insulating layer and the pixel-defined layer.

Alternatively, the OLED display device further includes a thin film transistor (TFT) array substrate arranged at a side of the anode layer away from the light-emitting layer.

Alternatively, the OLED display device further includes a color filter substrate arranged at a side of the cathode layer away from the light-emitting layer.

In another aspect, the present disclosure provides in embodiments a method for manufacturing an organic light-emitting diode (OLED) display device, including steps of forming an anode layer and a pixel-defined layer sequentially, and forming an insulating layer on the pixel-defined layer.

Alternatively, the step of forming the insulating layer on the pixel-defined layer includes:

forming a film layer made of a material identical to that of the insulating layer on the pixel-defined layer by evaporation or magnetron sputtering; and forming an aperture at the film layer at a position corresponding to the opening of the pixel-defined layer by a patterning process, so as to expose the anode layer, thereby to form the insulating layer.

The present disclosure at least has the following advantageous effect. The insulating layer having a refractive index greater than that of the pixel-defined layer is arranged between the light-emitting layer and the pixel-defined layer, so as to enable the light beam from the light-emitting layer and transmitted toward the pixel-defined layer to be totally reflected at the interface between the insulating layer and the pixel-defined layer, thereby to improve the light output efficiency of the OLED display device.

DETAILED DESCRIPTION

The present disclosure will be described hereinafter in conjunction with the drawings.

Figure 1:
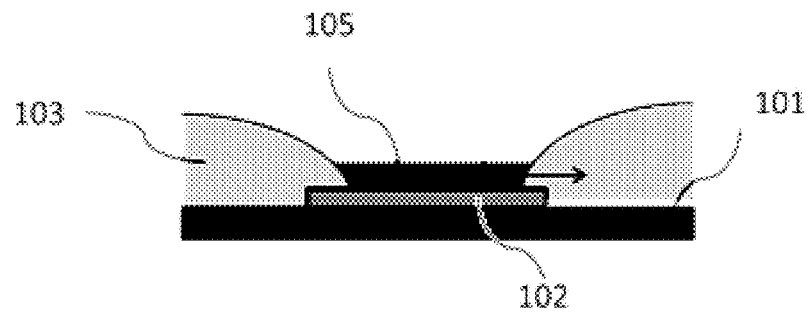
FIG. 1 is a partial, schematic view showing an OLED display device in the related art.
Figure 2:
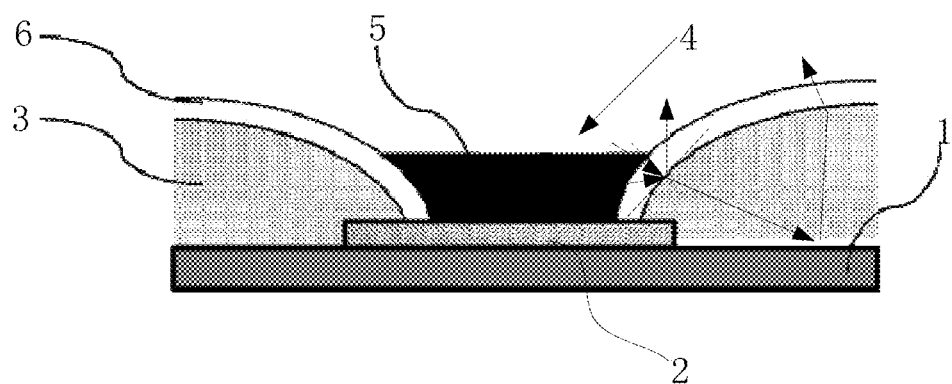
FIG. 2 is a partial, schematic view showing an OLED display device according to the first embodiment of the present disclosure.

As shown in FIG. 2, which is a partial, schematic view showing an OLED display device according to the first embodiment of the present disclosure, the OLED display device includes a substrate 1, and an anode layer 2 and a pixel-defined layer 3 both arranged on the substrate 1. The pixel-defined layer 3 is provided with an opening 4, so as to expose a portion of the anode layer 2. The light-emitting layer 5 is arranged in the opening. In addition, although not shown in FIG. 2, it should be appreciated that a transparent cathode layer is arranged above the opening 4 and parallel to the anode layer 2 with the light-emitting layer arranged therebetween, and an organic material of the light-emitting layer 5 emits light under the effect of a voltage difference between the anode layer 2 and the cathode layer.

Referring again to FIG. 2, an insulating layer 6 having a refractive index greater than that of the pixel-defined layer 3 is arranged between the light-emitting layer 5 and the pixel-defined layer 3.

The insulating layer 6 covers the pixel-defined layer 3, so that a light beam from the light-emitting layer 5 and transmitted toward the pixel-defined layer 3 is totally reflected at an interface between the insulating layer 6 and the pixel-defined layer 3. To be specific, the light beam having an incident angle greater than an angle of total reflection is totally reflected at the interface between the insulating layer 6 and the pixel-defined layer 3 toward the cathode layer, and the light beam having an incident angle less than the angle of total reflection is refracted into the pixel-defined layer 3. However, when the light beams transmitted inside the pixel-defined layer 3 are transmitted to the interface between the pixel-defined layer 3 and the insulating layer 6 after being reflected once or repeatedly, as shown in FIG. 2, no total reflection occurs inside the pixel-defined layer 3 because the light beams are transmitted from an optically thinner medium to an optically denser medium (the pixel-defined layer 3 is of a refractive index less than that of the insulating layer 6), and a majority of the light beams are transmitted to the cathode layer. As compared with the related art, the light output efficiency of the OLED display device in embodiments of the present disclosure is improved remarkably.

Figure 3:
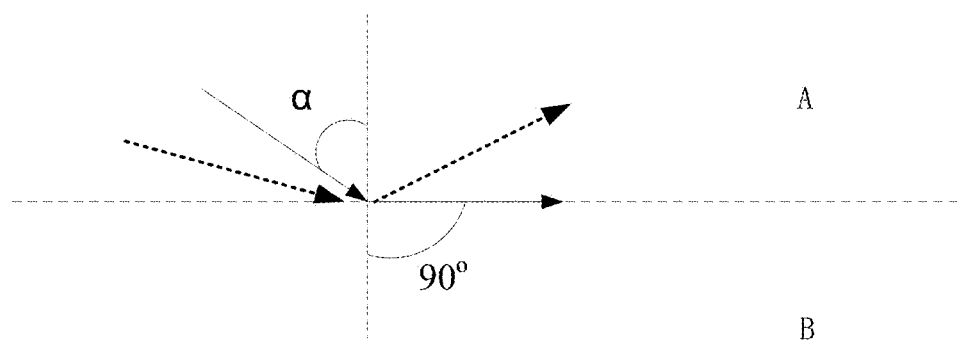
FIG. 3 is a schematic view showing the principle of total reflection.

It should be appreciated that, as shown in FIG. 3, the light beam passes from an optically denser medium A to an optically thinner medium B, and an incident angle α of the light beam entering an interface between two media is increased in such a manner that a refractive angle of the light beam when refracted by the optically thinner medium B is 90°. At this time, when the incident angle α continues to be increased, there is no refracted light beam entering the optically thinner medium B, and the entire light beam is reflected at the interface, i.e., the total reflection occurs. This critical incident angle α at which the total reflection occurs is just the angle of total reflection.

It should be appreciated that, the light-emitting layer 5 and the pixel-defined layer 3 are both made of an organic material and their refractive indices are not greatly different from each other, so generally there is no total reflection occurring between the light-emitting layer 5 and the pixel-defined layer 3. According to the embodiments of the present disclosure, by providing the insulating layer 6 between the light-emitting layer 5 and the pixel-defined layer 3, it is able to achieve the total reflection at the interface between the insulating layer 6 and the pixel-defined layer 3, thereby to project a portion of the light beams reaching the pixel-defined layer 3 toward the cathode layer in a totally reflective manner.

The optically denser medium is of a refractive index greater than that of the optically thinner medium, so according to the OLED display device in embodiments of the present disclosure, it is able to, through the insulating layer 6, totally reflect the light beam entering the interface between the pixel-defined layer 3 and the insulating layer 6 and having an incident angle greater than or equal to that of the angle of total reflection toward the cathode layer for display; and refract the light beam having an incident angle less than the angle of total reflection at the interface toward the pixel-defined layer 3. However, the light beams transmitted inside the pixel-defined layer 3 is reflected once or repeatedly, so a portion of the light beams may be transmitted to the interface between the pixel-defined layer 3 and the insulating layer 6 finally after the reflection. As shown in FIG. 2, because the pixel-defined layer 3 is of a refractive index less than that of the insulating layer 6, when the light beams are transmitted from the optically thinner medium to the optically denser medium, they are not totally reflected in the pixel-defined layer 3, by which a portion of the light beams may be transmitted toward the cathode layer.

Based upon the above, the angle of total reflection at which the light beam is totally reflected at the interface between the insulating layer 6 and the pixel-defined layer 3 is relevant to the materials of the insulating layer 6 and the pixel-defined layer 3. The angle of total reflection α=arcsin (a/b), wherein a represents a smaller one of the refractive indices of the media A and B, and b represents a larger one of the refractive indices of the media A and B. In this embodiment, alternatively, the pixel-defined layer 3 is made of PI, PMMA or phenolic resin, and the insulating layer 6 is made of $Ti_2O_3$, $TiO_2$ or ZnSe which has a refractive index greater than that of the material of the pixel-defined layer.

Further, referring to FIG. 2, the insulating layer 6 is of a curved, arc structure at the opening 4, so that a surface of the insulating layer 6 adjacent to the light-emitting layer 5 and a surface thereof adjacent to the pixel-defined layer 3 (i.e., an interface between the insulating layer 6 and the pixel-defined layer 3) are each of a curved, arc shape. In this way, it is able to totally reflect a majority of the light beams, which are transmitted from the light-emitting layer 5 and entered the insulating layer 6, at the interface between the insulating layer 6 and the pixel-defined layer 3, thereby to further improve the light output efficiency of the OLED display device.

Alternatively, the surface of the insulating layer 6 adjacent to the light-emitting layer 5 is of certain roughness, so as to form a plurality of microplanes oblique to each other at different angles. The oblique angle of the microplane at each position may be set in accordance with an incident angle of the light beam from the light-emitting layer 5 at the position. Through these microplanes, when the light beam from the light-emitting layer 5 reaches the surface of the insulating layer 6, it is refracted at an angle greater than or equal to that of the angle of total reflection, so as to achieve the total reflection in the insulating layer 6, thereby to further improve the light output efficiency of the OLED display device.

An available radian of the pixel-defined layer 3 is 20° to 50°, and the angle of total reflection at an interface between glass and air is 42° to 44°. When the radian of the pixel-defined layer 3 is greater than 45°, the light beam entering the layer 3 is totally reflected. Alternatively, an angle between the curved, arc structure of the insulating layer 6 and a plane where the anode layer 2 is located is 20° to 45°, which is less than the angle of total reflection at the interface between glass and air.

In addition, in embodiments of the present disclosure, the insulating layer 6 is of a thickness of 10 nm to 1000 nm, and the pixel-defined layer 3 is of a thickness of 1 µm to 3 µm.

In the first embodiment, the anode layer 2 is usually made of ITO (indium tin oxide), and the cathode layer is made of a transparent metallic material.

According to the OLED display device in the first embodiment, the insulating layer 6 having a refractive index greater than that of the pixel-defined layer 3 is arranged between the light-emitting layer 5 and the pixel-defined layer 3. As a result, it is able to totally reflect the light beam from the light-emitting layer 5 and transmitted to the pixel-defined layer 3 at the interface between the insulating layer 6 and the pixel-defined layer 3, thereby to improve the light output efficiency of the OLED display device.

The first embodiment relates to a passive OLED display device, the structure of which is known in the art and thus is not particularly defined herein.

Figure 4:
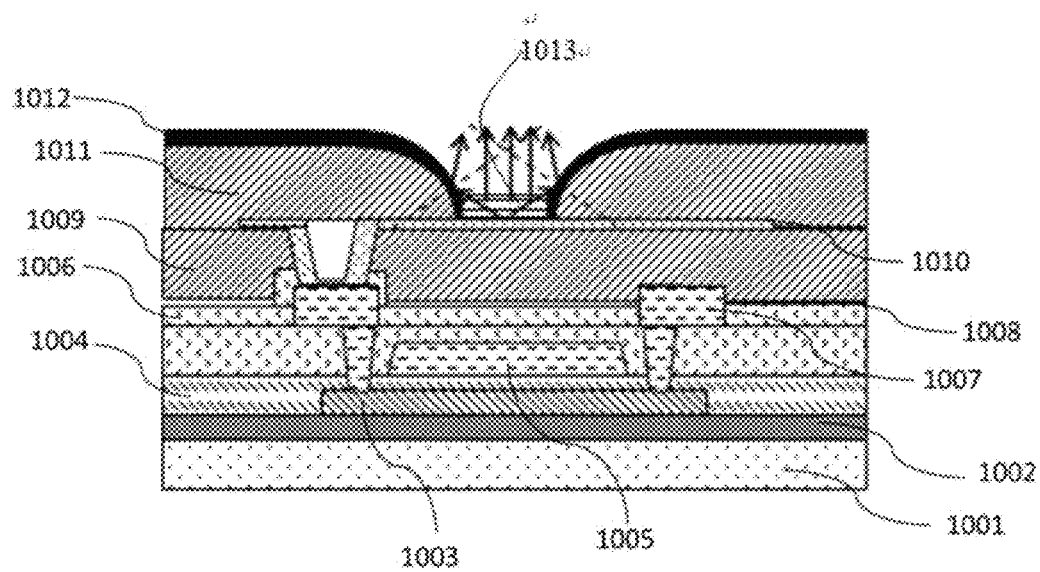
FIG. 4 is a partial, schematic view showing the OLED display device according to the second embodiment of the present disclosure.
Figure 5A:
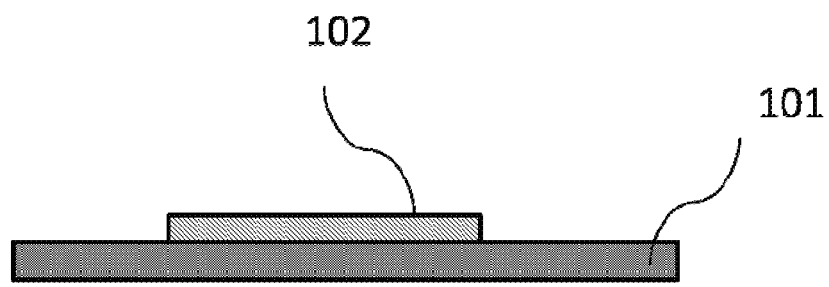
FIGS. 5a-5d are flow charts of a method for manufacturing the OLED display device according to the first embodiment of the present disclosure.
Figure 5B:
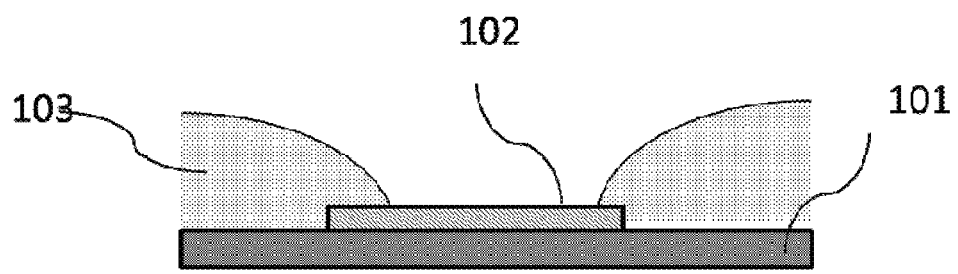
Figure 5C:
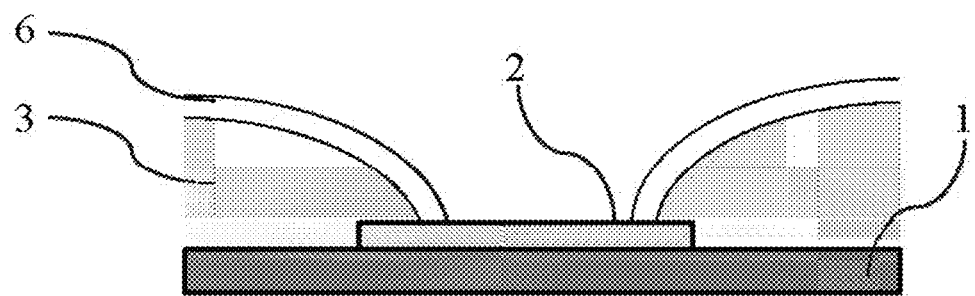
Figure 5D:
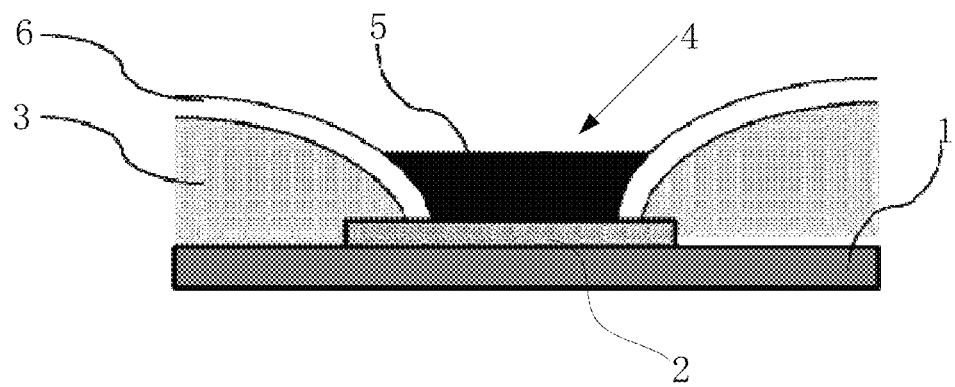

Also, the OLED display device may be an AMOLED display device, which includes a TFT array substrate arranged at a side of the anode layer away from the light-emitting layer. FIG. 4 is a partial, schematic view showing the OLED display device according to the second embodiment of the present disclosure.

As shown in FIG. 4, the OLED display device in the second embodiment includes: a substrate 1001, which is usually made of glass; a buffer layer 1002 arranged on the substrate 1001; an active layer 1003 and a gate insulating layer 1004 arranged on the buffer layer 1002; a gate electrode 1005 arranged on the gate insulating layer 1004; an insulating layer arranged on the gate electrode 1005; source and drain electrodes 1007 arranged at both sides of the gate electrode 1005 and connected to the active layer 1003 through a via-hole in the gate insulating layer 1006; a passivation layer 1008 arranged on the insulating layer 1006; an planarization layer 1009 arranged on the passivation layer 1008; a pixel electrode 1010 arranged on the planarization layer 1009; and a pixel-defined layer 1011 arranged on the pixel electrode 1010 and provided with an opening so as to expose a portion of the pixel electrode 1010, the exposed portion of the pixel electrode 1010 forming a pixel unit of the display device.

In addition, the pixel electrode 1010 forms the anode layer of the AMOLED display device, and a light-emitting layer 1013 is formed at the opening above the pixel electrode 1010. It should be appreciated that, a cathode layer is arranged on the light-emitting layer 1013, so as to cooperate with the pixel electrode 1010 to enable the organic material of the light-emitting layer 1013 to emit light. Further, when the AMOLED display device is of a top-emission structure, the cathode layer is covered with a transparent packaging cover.

Same with the first embodiment, in the second embodiment, an insulating layer 1012 having a refractive index greater than that of the pixel-defined layer 1011 is arranged between the pixel-defined layer 1011 and the light-emitting layer 1013, and covers the pixel-defined layer 1011, so as to enable a light beam from the light-emitting layer 1013 and transmitted toward the pixel-defined layer 1011 to be totally reflected at an interface between the insulating layer 1012 and the pixel-defined layer 1011. To be specific, the light beam having an incident angle greater than an angle of total reflection is totally reflected at the interface between the insulating layer 1012 and the pixel-defined layer 1011 toward the cathode layer, and the light beam having an incident angle less than the angle of total reflection is refracted into the pixel-defined layer 1011. However, when the light beams transmitted inside the pixel-defined layer 1011 are transmitted to the interface between the pixel-defined layer 1011 and the insulating layer 1012 after being reflected once or repeatedly, as shown in FIG. 2, no total reflection occurs inside the pixel-defined layer 1011 because the light beams are transmitted from an optically thinner medium to an optically denser medium (the pixel-defined layer 1011 is of a refractive index less than that of the insulating layer 1012), and a majority of the light beams are transmitted to the cathode layer. As compared with the related art, the light output efficiency of the OLED display device in the second embodiment of the present disclosure is improved remarkably.

Alternatively, the pixel-defined layer 1011 is made of PI, PMMA or phenolic resin, and the insulating layer 1012 is made of $Ti_2O_3$, $TiO_2$ or ZnSe which has a refractive index greater than that of the pixel-defined layer. The anode layer 1010 is usually made of ITO, and the cathode layer is made of a metal or an alloy having certain transmittance.

Further, same with the first embodiment, as shown in FIG. 4, the insulating layer 1012 in the second embodiment is of a curved, arc structure at the opening, and a surface of the insulating layer 1012 adjacent to the light-emitting layer 1013 is of certain roughness, so as to form a plurality of microplanes oblique to each other at different angles. As a result, a majority of the light beams from the light-emitting layer 1013 and transmitted toward the insulating layer 1012 is totally reflected at the interface between the insulating layer 1012 and the pixel-defined layer 1011, so as to further improve the light output efficiency of the OLED display device.

Alternatively, an angle between the curved, arc structure of the insulating layer 1012 and a plane where the pixel electrode is located is 20° to 45°, the insulating layer 1012 is of a thickness of 10 nm to 1000 nm, and the pixel-defined layer 1011 is of a thickness of 1 µm to 3 µm.

The structure of the AMOLED display device is known in the art, and thus will not be particularly defined herein.

In the first and second embodiments, the OLED display device may further include a color filter substrate arranged at a side of the cathode layer away from the light-emitting layer. When a white light beam is emitted from the light-emitting layer, a color image is displayed by means of the color filter substrate.

In addition, it should be appreciated that, apart from the light-emitting layer, such functional layers as a hole injection layer, a hole transmission layer, an electron transmission layer and an electron injection layer may be arranged between the anode layer and the cathode layer.

Further, although with the above-mentioned description, the present disclosure is not limited to the OLED display device with a top-emission structure, and instead, it may also be applied to the OLED display device with a bottom-emission structure. The structure of the OLED display device with the bottom-emission structure is known in the art, and thus will not be particularly defined herein.

The present disclosure provides in embodiments a method for manufacturing the above-mentioned OLED display device, including steps of forming the anode layer and the pixel-defined layer sequentially, and forming the insulating layer on the pixel-defined layer.

Referring to FIGS. 5a-5d in conjunction with FIG. 2, the method for manufacturing the OLED display device in the first embodiment includes the following steps.

Step 1: forming the anode layer 2 on the substrate 1 by a first patterning process.

Step 2: forming the pixel-defined layer 3 on the anode layer 2 by a second patterning process, and providing the pixel-defined layer 3 with an opening at a position corresponding to the anode layer 2 so as to expose the anode layer 2. An outer surface of the pixel-defined layer 3 is of a curved, arc structure, and an angle between the curved, arc structure and the anode layer 2 is 20° to 45°. In addition, the pixel-defined layer 3 at the opening may be further irradiated by UV light, so as to improve its slope angle.

Step 3: forming a film layer made of a material identical to that of the insulating layer on the entire pixel-defined layer 3 by evaporation or magnetron sputtering, and providing the film layer with a desired pattern by a third patterning process, i.e., forming an aperture corresponding to the pixel-defined layer 3, so as to form the insulating layer 6.

Step 4: treating a surface of the insulating layer 6 by a dry-etching process, so as to improve its surface roughness, thereby to further improve the light output efficiency.

Step 5: forming functional layers, such as a light-emitting layer, a hole injection layer, a hole transmission layer, an electron transmission layer and an electron injection layer, between the cathode layer and the anode layer by evaporation or ink-jetting.

It should be appreciated that, the first, second and third patterning processes mentioned above may each include exposing, developing and etching steps.

The method for manufacturing the OLED display device according to the second embodiment may be identical to the above-mentioned method for manufacturing the OLED display device according to the first embodiment. In addition, the methods for forming such structures as the pixel electrode and the TFTs therebelow are known in the art and meanwhile are not a focus for improvement, thus they will not be particularly defined herein.

The above are merely the preferred embodiments of the present disclosure. It is to be noted that, a person skilled in the art may make further modifications and improvements without departing from the spirit of the present disclosure, and these modifications and improvements shall also fall within the scope of the present disclosure.

What is claimed is:

1. An organic light-emitting diode (OLED) display device, an anode layer, a cathode layer, and a pixel-defined layer and a light-comprising emitting layer both arranged between the anode layer and the cathode layer, wherein the pixel-defined layer is provided with an opening, the light-emitting layer is arranged in the opening, and an insulating layer having a refractive index greater than that of the pixel-defined layer is arranged between the light-emitting layer and the pixel-defined layer.

2. The OLED display device according to claim 1, wherein the pixel-defined layer is made of polyimide (PI), polymethyl methacrylate (PMMA) or phenolic resin, and the insulating layer is made of $Ti_2O_3$, $TiO_2$ or ZnSe.

3. The OLED display device according to claim 1, wherein the insulating layer is of a curved, arc structure at the opening.

4. The OLED display device according to claim 3, wherein an angle between the curved, arc structure and a plane where the anode layer is located is 20° to 45°.

5. The OLED display device according to claim 1, wherein the insulating layer is of a thickness of 10 nm to 1000 nm.

6. The OLED display device according to claim 3, wherein a surface of the insulating layer adjacent to the light-emitting layer is provided with a plurality of microplanes oblique to each other at different angles and configured to refract a light beam entering the insulating layer, so as to totally reflect the refracted light beam at an interface between the insulating layer and the pixel-defined layer.

7. The OLED display device according to claim 1, further comprising a thin film transistor (TFT) array substrate arranged at a side of the anode layer away from the light-emitting layer.

8. The OLED display device according to claim 1, further comprising a color filter substrate arranged at a side of the cathode layer away from the light-emitting layer.

9. A method for manufacturing the organic light-emitting diode (OLED) display device according to claim 1, comprising steps of forming an anode layer and a pixel-defined layer sequentially, and forming an insulating layer on the pixel-defined layer.

10. The method according to claim 9, wherein the step of forming the insulating layer on the pixel-defined layer comprises:
   forming a film layer made of a material identical to that of the insulating layer on the pixel-defined layer by evaporation or magnetron sputtering; and
   forming an aperture at the film layer at a position corresponding to the opening of the pixel-defined layer by a patterning process, so as to expose the anode layer, thereby to form the insulating layer.

11. The method according to claim 9, wherein the insulating layer is of a curved, arc structure at the opening.

12. The method according to claim 9, wherein an angle between the curved, arc structure and a plane where the anode layer is located is 20° to 45°.

13. The method according to claim 9, wherein the insulating layer is of a thickness of 10 nm to 1000 nm.

14. The method according to claim 11, wherein the step of forming the insulating layer on the pixel-defined layer comprises:
   treating a surface of the insulating layer by a dry-etching process, so as to form a plurality of microplanes oblique to each other at different angles.

15. The method according to claim 9, wherein the pixel-defined layer is made of polyimide (PI), polymethyl methacrylate (PMMA) or phenolic resin, and the insulating layer is made of $Ti_2O_3$, $TiO_2$ or ZnSe.

16. The OLED display device according to claim 7, further comprising a color filter substrate arranged at a side of the cathode layer away from the light-emitting layer.

17. The method according to claim 10, wherein the insulating layer is of a curved, arc structure at the opening.

18. The method according to claim 10, wherein an angle between the curved, arc structure and a plane where the anode layer is located is 20° to 45°.

19. The method according to claim 10, wherein the insulating layer is of a thickness of 10 nm to 1000 nm.

* * * * *